United States Patent
Cho et al.

(10) Patent No.: US 7,750,469 B2
(45) Date of Patent: Jul. 6, 2010

(54) INSULATING LAYER BETWEEN BUMPS OF SEMICONDUCTOR CHIP, AND DISPLAY PANEL USING THE SAME WITH ANISOTROPIC CONDUCTIVE FILM BETWEEN SEMICONDUCTOR CHIP AND SUBSTRATE

(75) Inventors: Won Gu Cho, Seoul (KR); Ho Min Kang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 316 days.

(21) Appl. No.: 11/509,482

(22) Filed: Aug. 24, 2006

(65) Prior Publication Data
US 2007/0045841 A1  Mar. 1, 2007

(30) Foreign Application Priority Data
Aug. 24, 2005  (KR) .................... 10-2005-0077657

(51) Int. Cl.
  *H01L 23/48*  (2006.01)
  *H01L 21/00*  (2006.01)
(52) U.S. Cl. .................... 257/738; 257/778; 257/783; 257/E23.021; 257/E21.513; 438/108; 438/119
(58) Field of Classification Search .............. None
See application file for complete search history.

(56) References Cited

U.S. PATENT DOCUMENTS

| | | | | |
|---|---|---|---|---|
| 5,903,056 | A * | 5/1999 | Canning et al. | 257/773 |
| 5,943,597 | A * | 8/1999 | Kleffner et al. | 438/613 |
| 6,451,875 | B1 * | 9/2002 | Suga et al. | 523/204 |
| 6,518,665 | B1 * | 2/2003 | Westby et al. | 257/738 |
| 6,867,505 | B2 * | 3/2005 | Lee et al. | 257/783 |
| 2001/0054753 | A1 * | 12/2001 | Oya | 257/676 |
| 2002/0105078 | A1 * | 8/2002 | Lee et al. | 257/746 |
| 2005/0104225 | A1 * | 5/2005 | Huang | 257/779 |
| 2006/0022340 | A1 * | 2/2006 | Ho et al. | 257/750 |
| 2006/0115927 | A1 * | 6/2006 | Yeo et al. | 438/107 |

FOREIGN PATENT DOCUMENTS

| | | |
|---|---|---|
| JP | 2003332384 | 5/2002 |
| JP | 2005109023 | 9/2003 |
| KR | 0456064 | 7/2001 |

\* cited by examiner

*Primary Examiner*—Alonzo Chambliss
(74) *Attorney, Agent, or Firm*—Cantor Colburn LLP

(57) ABSTRACT

A semiconductor chip and manufacturing method thereof, the semiconductor chip including a plurality of bumps connected to a driving circuit integrated on a semiconductor substrate and an organic insulating layer disposed on the driving circuit. The organic insulating layer extends from the semiconductor substrate less than the plurality of bumps such that a lower edge of the plurality of bumps protrudes further than a lower edge of the organic insulating layer.

13 Claims, 17 Drawing Sheets

INSULATING LAYER BETWEEN BUMPS OF SEMICONDUCTOR CHIP, AND DISPLAY PANEL USING THE SAME WITH ANISOTROPIC CONDUCTIVE FILM BETWEEN SEMICONDUCTOR CHIP AND SUBSTRATE

This application claims priority to Korean Patent application No. 2005-0077657 filed on Aug. 24, 2005, and all the benefits accruing therefrom under 35 U.S.C. §119, the contents of which are herein incorporated by reference in its entirety.

BACKGROUND OF THE INVENTION

1. Field of the Invention

The present invention relates to a semiconductor chip and display panel using the same, and more particularly, to a semiconductor chip and manufacturing method thereof which can improve the remaining ratio of anisotropic conductive particle, and a display panel using the semiconductor chip and manufacturing thereof.

2. Description of the Related Art

As flat panel displays, which are popular as a display device, there are a liquid crystal display (LCD) using a liquid crystal, a plasma display panel (PDP) using a discharge of an inert gas, and an organic electroluminescent display (OLED) using an organic light emitting diode. Among these displays, the PDP is applied to large-sized televisions (TVs), whereas the LCD and OLED are applied to many fields in various sizes ranging from small to large-sized products, such as cellular phones, notebook computers, monitors, TVs, etc.

Such a flat panel display includes a display panel having a pixel matrix for displaying images, and a panel driving circuit for driving the display panel. The panel driving circuit is integrated in a semiconductor chip shape and then electrically connected to the display panel. To connect such a driving circuit chip (hereinafter, referred to as a driving chip) to the display panel, a tape automated bonding (TAP) method and a chip-on-glass (COG) method are typically used.

The TAP method is to attach a tape carrier package (TCP) or chip-on-film (COF) on which the driving chip is packaged to the display panel by using an anisotropic conductive film (ACF). The COG method is to directly package the driving chip to the display panel by using the ACF and this method is mainly applied to the display panel necessitating low cost, small size, and thin thickness.

FIG. 1 illustrates a terminal part of a driving chip packaged on a substrate of a display panel by the COG method.

Referring to FIG. 1, a driving chip 20 is electrically connected to an electrode pad 12 formed on a substrate 10 of the display panel through an ACF 15 and attached to the substrate 10 through the ACF 15.

In more detail, the driving chip 20 includes a chip pad 24 formed on a silicon wafer 22, a protective layer 26 which protects the silicon wafer 22 and has a contact hole for exposing the chip pad 24, and a bump 28 which is connected to the chip pad 24 through the contact hole of the protective layer 26 and serves as a terminal.

The driving chip 20 is packaged or attached on the substrate 10 of the display panel through the ACF 15. In exemplary embodiments, the ACF 15 may include an ACF resin 14 including a conductive particle 16. The ACF 15 may be coated on a pad region of the substrate 10 having the electrode pad 12 formed thereon. The driving chip 20 is aligned, heated and pressed, thereby packaging the driving chip 20 on the substrate 10 of a display panel. The conductive particles 16 of the ACF 15 are positioned between the bump 28 of the driving chip 20 and the electrode pad 12 formed on the substrate 10 and electrically connect the bump 28 to the electrode pad 12.

The number of the conductive particles 16 between the bump 28 and the electrode pad 12, hereinafter the "remaining ratio of the conductive particles 16", determines the connection resistance between the bump 28 and the electrode pad 12. Accordingly, the remaining ratio of the conductive particles 16 should be of sufficient quantity or level so as to ensure the reliability of a driving signal.

Since in current technology the remaining amount of the conductive particles between the bump and the electrode pad is relatively very small, a technique for increasing the remaining ratio of the conductive particles has been demanded. Although a method of increasing the amount of conductive particles contained in the ACF may be considered in order to increase the remaining ratio of the conductive particles under the bump, this method raises the price of raw materials of the ACF.

SUMMARY OF THE INVENTION

An exemplary embodiment of the present invention provides a semiconductor chip and manufacturing method thereof which may improve the remaining ratio of conductive particles of an ACF, and a display panel using the semiconductor chip and manufacturing method thereof.

One exemplary embodiment of the present invention, provides a semiconductor chip including a plurality of bumps connected to a driving circuit integrated on a semiconductor substrate and an organic insulating layer disposed on the driving circuit. The organic insulating layer is extended from the semiconductor substrate less than the plurality of bumps such that the plurality of bumps protrudes further than a lower edge of the organic insulating layer.

Another exemplary embodiment provides a method of manufacturing a semiconductor chip according to the present invention, including forming a plurality of bumps connected to a driving circuit integrated on a semiconductor substrate and forming an organic insulating layer on the driving circuit. The organic insulating layer is extended from the semiconductor substrate less than the plurality of bumps such that the plurality of bumps protrudes further than the organic insulating layer.

Another exemplary embodiment of the present invention provides a display panel in which a semiconductor chip is packaged through an anisotropic conductive film, including an electrode pad formed on a substrate and connected to a bump formed on the semiconductor chip through a conductive particle in the anisotropic conductive film, and a first insulating layer formed on the substrate to have an open hole isolating the electrode pad.

Another exemplary embodiment provides a method of manufacturing a display panel in which a semiconductor chip is packaged according to the present invention, including forming an electrode pad on a substrate and connected to a signal line, forming a first insulating layer on the substrate, the first insulating layer having an open hole isolating the electrode pad on the substrate, and packaging the semiconductor chip on the substrate through an anisotropic conductive film to connect a bump of the semiconductor chip to the electrode pad through a conductive particle contained in the anisotropic conductive film.

Another exemplary embodiment of the present invention provides a display panel including a semiconductor chip including a first substrate and first insulating layer, a second substrate including an electrode pad connected to a signal line formed on the second substrate, and an anisotropic conductive film attaching the semiconductor chip to the second substrate and including a conductive particle connecting a bump of the semiconductor chip to the electrode pad. The semiconductor chip includes a plurality of bumps connected to a driving circuit integrated on the first substrate and a first insulating layer disposed on the driving circuit Another exemplary embodiment provides a method of manufacturing a display panel according to the present invention including providing a semiconductor chip, providing the display panel including an exposed electrode pad, and packaging the semiconductor chip in the display panel through an anisotropic conductive film including a conductive particle. Forming the semiconductor chip includes forming a plurality of bumps connected to a driving circuit integrated on a first substrate and forming a first insulating layer on the driving circuit. The first insulating layer is extended from the first substrate less than the plurality of bumps.

Another exemplary embodiment of the present invention provides a semiconductor chip including a plurality of bumps connected to a driving circuit integrated on a semiconductor substrate and an organic insulating layer formed with a smaller thickness than the plurality of bumps, the organic insulating layer being formed between pairs of bumps. Another exemplary embodiment provides a method of manufacturing a semiconductor chip according to the present invention including forming a plurality of bumps connected to a driving circuit integrated on a semiconductor substrate and forming an organic insulating layer with a smaller thickness than the plurality of bumps, the organic insulating layer being formed between pairs of bumps.

Another exemplary embodiment of the present invention provides a display panel including a semiconductor chip including a plurality of bumps connected to a driving circuit integrated on a first substrate and a first insulating layer formed with a smaller thickness than the plurality of bumps, the first insulating layer being formed between pairs of bumps, a second substrate including an electrode pad connected to a signal line formed thereon, and an anisotropic conductive film attaching the semiconductor chip to the second substrate and including a conductive particle connecting a bump of the semiconductor chip to the electrode pad.

Another exemplary embodiment provides a method of manufacturing a display panel according to the present invention including providing a semiconductor chip including a plurality of bumps connected to a driving circuit integrated on a first substrate and a first insulating layer being formed with a smaller thickness than the plurality of bumps, the first insulating layer being formed between pairs of bumps, providing the display panel exposing an electrode pad, and packaging the semiconductor chip in the display panel through an anisotropic conductive film including a conductive particle.

BRIEF DESCRIPTION OF THE DRAWINGS

The above and other features and advantages of the present invention will become more apparent from the following detailed description when taken in conjunction with the accompanying drawings in which.

DETAILED DESCRIPTION OF THE PREFERRED EMBODIMENT

Figure 1:
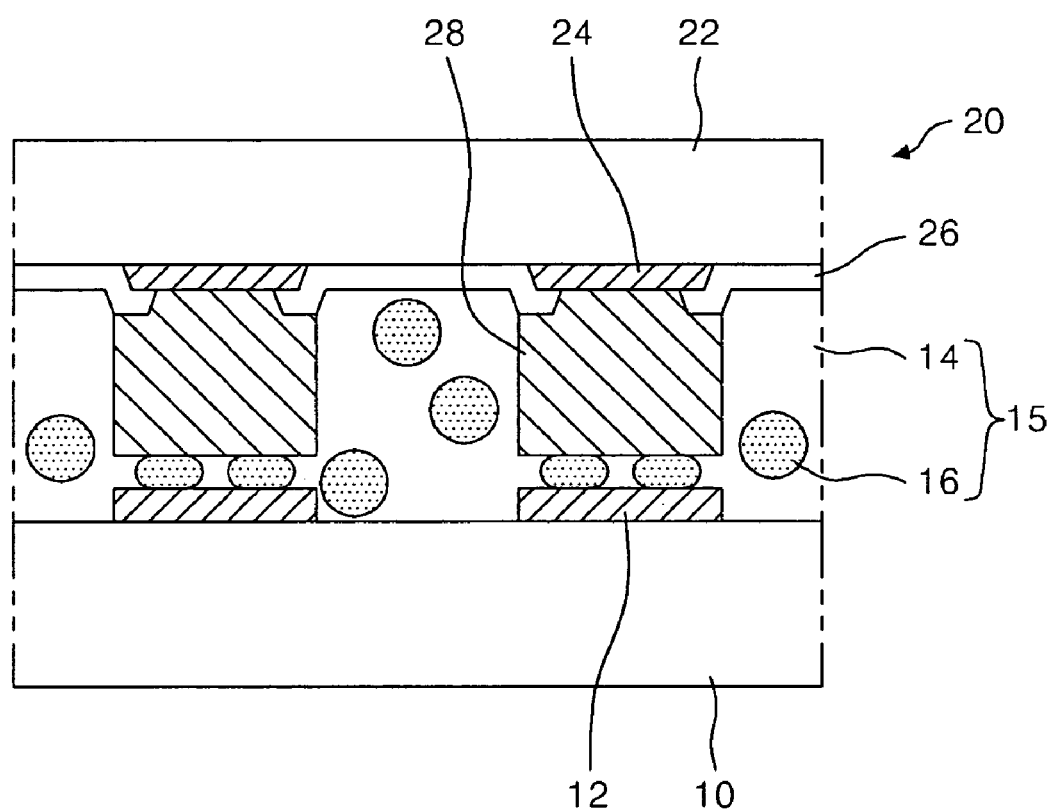
FIG. 1 illustrates a driving chip packaged in a conventional display panel by a COF method.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "lower" and "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will-be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

Prior to a description of an exemplary embodiment of the present invention, the reason why the remaining ratio of conductive particles of an ACF between a bump of a driving chip and a pad of a display panel may need to be relatively low will now be described with reference to FIG. 2.

Figure 2:
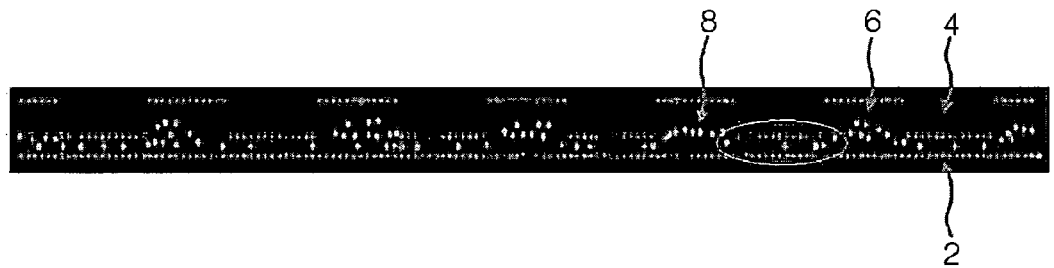
FIG. 2 is a photograph illustrating a contact part between a plurality of bumps formed on a conventional driving chip and a substrate.

FIG. 2 is a photograph illustrating a contact part between a plurality of bumps formed on a conventional driving chip and a substrate.

Referring to FIG. 2, it can be seen that the remaining ratio of ACF conductive particles 8 in a space 6 between bumps 4 is higher than that in an area under the bump 4 of a driving chip packaged on a substrate 2. Pressure acting upon an ACF resin under the bump 4 of the driving chip packaged on a substrate 2 is higher than in the space 6 between the bumps 4 when an ACF is coated on the substrate 2 and then the driving chip is aligned heated and pressed on the substrate 2. Due to a difference in pressure between under the bump 4 of the driving chip packaged on a substrate 2 and in the space 6 between the bumps 4, a flow of the ACF resin is directed toward the space 6 between the bumps 4 from under the bump 4 of the driving chip packaged on a substrate 2. The ACF conductive particles 8 move toward or with the flow of the ACF resin. Consequently, the remaining ratio of the conductive particles 8 under the bump 4 of the driving chip packaged on a substrate 2 is decreased. The conductive particles 8 that ultimately gather together within the space 6 between the bumps 4 becomes increasingly large. Therefore, the gathering of conductive particles 8 in the space 6 may lead to an electrical short between the bumps 4 Reliability may deteriorate due to a decrease in the remaining ratio of the conductive particles 8 under the bump 4 of the driving chip packaged on a substrate 2.

In an exemplary embodiment according to the present invention, the remaining ratio of the conductive particles existing under the bump of a driving chip packaged on a substrate may be improved by reducing a difference in pressure between under the bump of the driving chip packaged on a substrate and in the space between the bumps, essentially decreasing a flow of the ACF conductive particles during manufacturing processes.

Hereinafter, the present invention will be described in detail with reference to the accompanying drawings.

Figure 3:
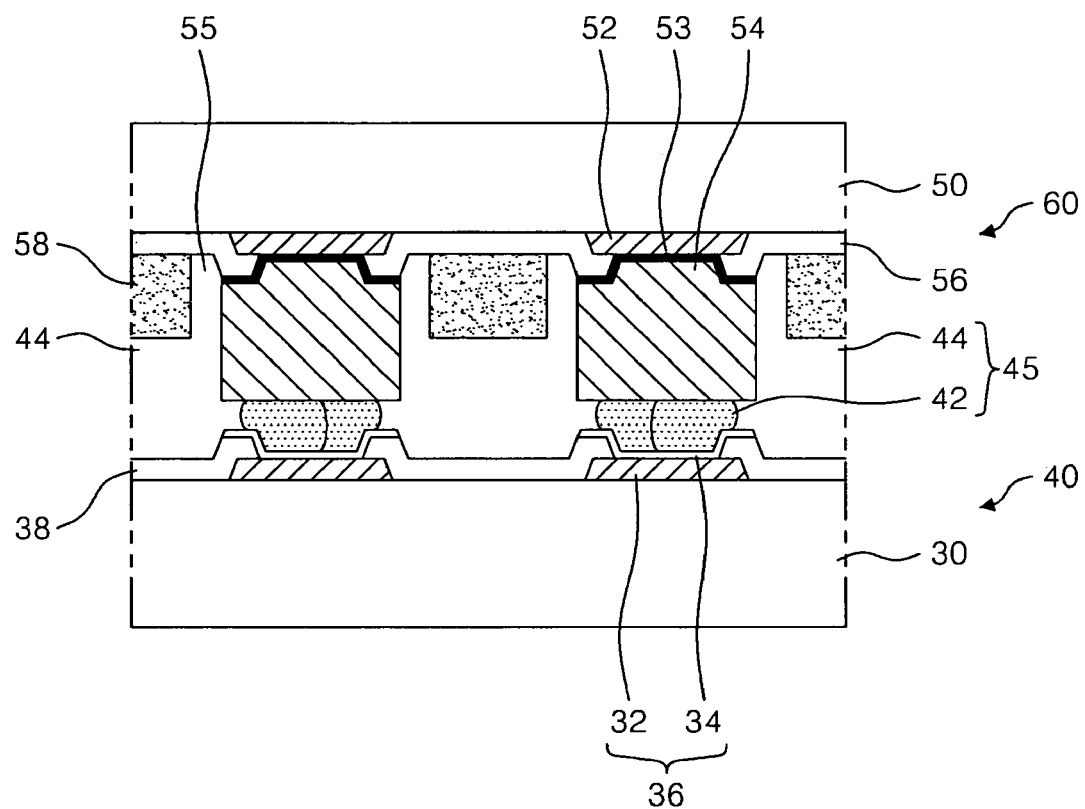
FIG. 3 is a cross-sectional view partially illustrating an exemplary embodiment of a display panel in which a COG type driving chip is packaged according to the present invention.
Figure 4:
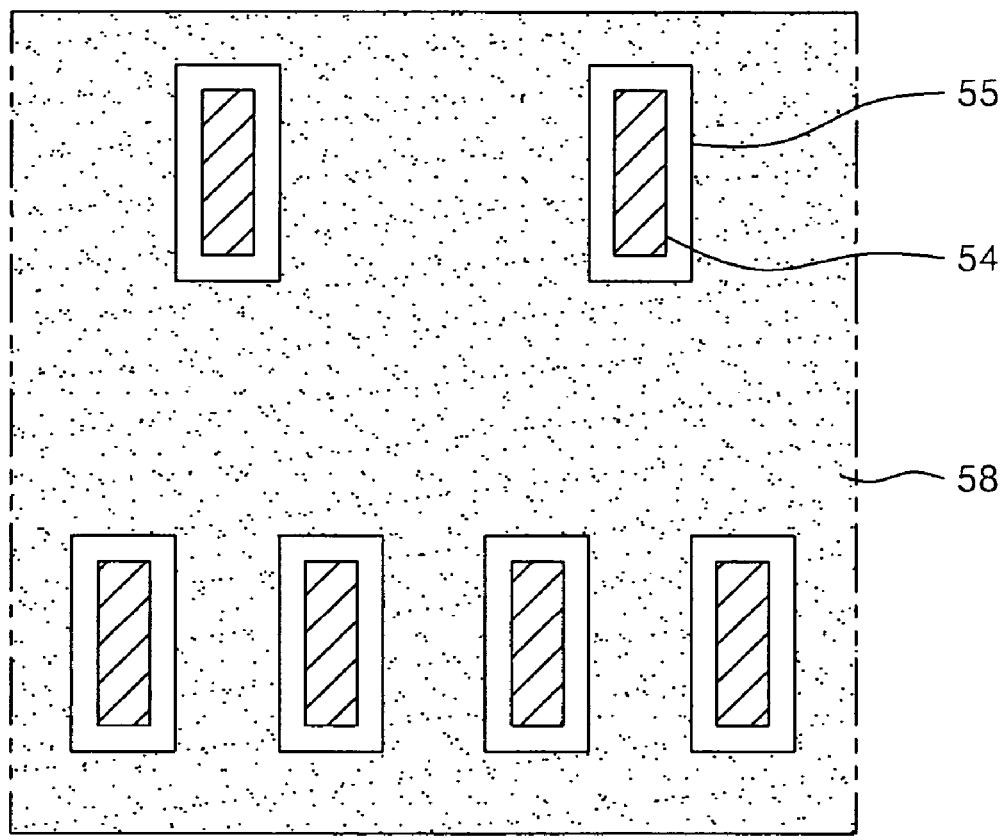
FIG. 4 is a plane view partially illustrating a lower surface of the driving chip shown in FIG. 3.
Figure 5:
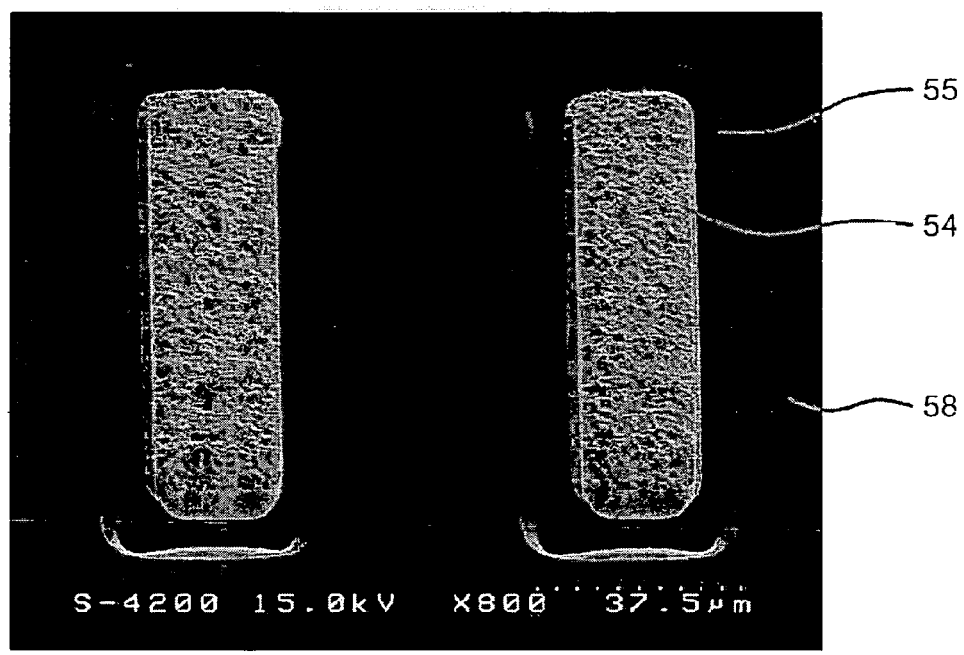
FIG. 5 is a photograph illustrating an exemplary embodiment of a bump area of the driving chip according to the present invention.

FIG. 3 is a cross-sectional view partially illustrating an exemplary embodiment of a display panel 40 in which a driving chip 60 is packaged according to the present invention. FIGS. 4 and 5 are a plane view and a photograph, respectively, illustrating an exemplary embodiment a lower surface on which bumps 54 in the driving chip 60 shown in FIG. 3 are formed.

Referring to FIG. 3, the driving chip 60 is electrically connected to an electrode pad 36 formed on a substrate 30 of a display panel 40 through an ACF 45 and attached to the substrate 30 through the ACF 45.

The display panel 40 includes the electrode pad 36 formed on the lower substrate 30 and connected to signal lines of an image display part (not shown).

The electrode pad 36 includes a lower electrode pad 32 extended from the signal lines of the image display part and an upper electrode pad 34 connected to the lower electrode pad 32 through a contact hole penetrating an insulating layer 38. In exemplary embodiments, the lower electrode pad 32 may be formed of an opaque metal together with the signal lines of the image display part. The upper electrode pad 34 may be formed of a transparent conductive material for protecting the lower electrode pad 32. In one exemplary embodiment, an upper electrode pad 34 formed of a transparent conductive material may be patterned together with a pixel electrode (not shown) for transmitting light by a sub pixel unit (not shown) in the image display part.

The driving chip 60 includes a chip pad 52 connected to a driving circuit formed on a silicon wafer 50, a protective layer 56 formed on the silicon wafer 50 and a bump 54. The protective layer 56 includes a contact hole exposing the chip pad 52. The bump 54 is connected to the chip pad 52 through the contact hole of the protective layer 56 and serves as a terminal. The driving chip 60 may also include an organic insulating layer 58 surrounding the bump 54. In exemplary embodiments, the organic insulating layer 58 may have a thickness as measured in a direction substantially perpendicular to the silicon wafer 50 that is less than a thickness of the bump 54.

In another exemplary embodiment, a lower edge of the organic insulating layer 58 may not extend to a lower edge of the bump and may be positioned between a surface of the protective layer 56 and the lower edge of the bump 54.

In exemplary embodiments, the chip pad 52 may include, but is not limited to, a metal, such as aluminum (Al). The bump 54 may include, but is not limited to, a metal, such as gold (Au). In other exemplary embodiments, a barrier layer 53 for protecting the chip pad 52 may be formed between the chip pad 52 and the bump 54. The barrier layer 53 may include, but is not limited to, metal.

The protective layer 56 is formed on the silicon wafer 50 on which the chip pad 52 is formed and protects the silicon wafer 50 where the driving circuit is formed. The protective layer 56 includes the contact hole exposing the chip pad 52. In exemplary embodiments, the protective layer 56 may include, but is not limited to, an insulating material such as SiNx.

The barrier layer 53 and the bump 54 are connected to the chip pad 52 exposed through the contact hole of the protective layer 56.

An organic insulating layer 58 is formed on the protective layer 56 on which the bump 54 is formed in order to protect the driving circuit included in the driving chip 60. In one exemplary embodiment, the organic insulating layer 58 may be include, but is not limited to, polyimide series. The organic insulating layer 58 is extended, as illustrated in FIGS. 4 and 5, to a peripheral area of the driving chip 60 in which the bump 54 is formed and includes an open hole 55 exposing the bump 54. This peripheral area may also be referred to as a "terminal area."

In exemplary embodiments, a height or thickness of the organic insulating layer 58 may be lower than that of the bump 54. When the driving chip 60 is packaged on the substrate 30, a difference in pressure between under the bump 54 of the driving chip 60 and in a space between the bumps 54 is reduced. Advantageously, ACF conductive particles 42 may be prevented from escaping into the space between the bumps 54 from under the bump 54 of the driving chip 60. The open hole 55 formed on the organic insulating layer 56 has a wider cross sectional area than the bump 54 as illustrated in FIGS. 4 and 5 so as to completely and sufficiently expose the bump 54. An edge of the open hole 55 is separated from that of the bump 54, forming a gap, such that a cross sectional area of the bump 54 available to contact with the ACF conductive particles 42 is sufficiently ensured. In alternative embodiments, the open hole 55 may have a cross sectional area that is substantially similar to or essentially the same as the bump 54 such that the organic insulating layer 58 may be in contact with sides of the bump 54.

Referring again to FIG. 3, the driving chip 60 is packaged on the substrate 30 of the display panel 40 through the ACF 45. The ACF 45 may include an ACF resin 44 including the conductive particles 42. The ACF 45, is coated on a pad region of the substrate 30 on which the electrode pad 36 is formed, and the driving chip 60 is aligned, heated and pressed to package the driving chip 60 on the substrate 30 of the display panel 40. Since the organic insulating layer 58 having a thickness less than that of the bump 54 occupies the space between the bumps 54, a difference of pressures under the bump 54 of the driving chip 60 and in the space between the bumps, or under the organic insulating layer 58, may be decreased. Commensurate with the decrease in pressure difference, a flow of the conductive particles 42 decreases along with a flow of the ACF resin 44 and the number of the conductive particles 42 escaping into the space between the bumps 54 from under the bump 54 of the driving chip 60 may be reduced. Advantageously, since the remaining ratio of the conductive particles 42 under the bump 54 is improved, or essentially increased, the connection resistance between the bump 54 of the driving chip 60 and the electrode pad 36 of the display panel 40 may decrease.

In an exemplary embodiment, if the height of the organic insulating layer 58 is the same or higher than that of the bump 54, such that a lower edge of the organic insulating layer 58 is substantially at the same level as a lower edge of the bump 54, a modification rate of the conductive particles 42 between the bump 54 and the electrode pad 36 decreases and the connection resistance may increase. The organic insulating layer 58 extends downward from the protective layer 56, or the silicon wafer 50. In one exemplary embodiment, it is preferable to form the organic insulation layer 58 to extend to a position above that of the lower edge of the bump 54, or include a smaller thickness than that of the bump 54.

FIGS. 6A to 6D are cross sectional view illustrating an exemplary embodiment of a manufacturing method of the driving chip 60 shown in FIG. 3 according to the present invention.

Figure 6A:
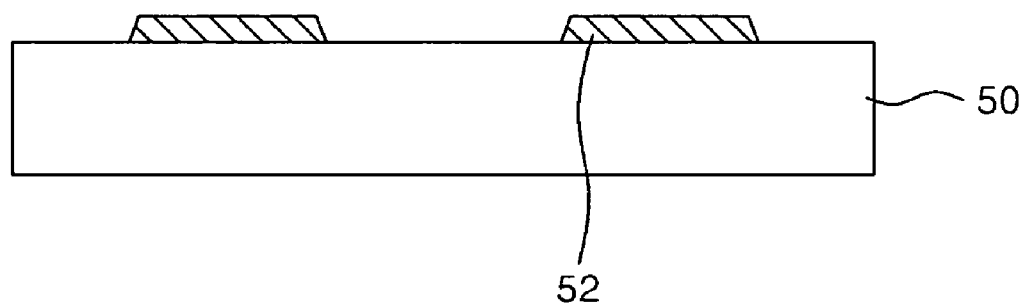
FIGS. 6A to 6D are cross sectional view illustrating an exemplary embodiment of a manufacturing method of the driving chip shown in FIG. 3.

Referring to FIG. 6A, the chip pad 52 is formed on the silicon wafer 50 together with electrodes of the driving circuit (not shown). In exemplary embodiments, the chip pad 52 may be formed together with the electrodes of the driving circuit by depositing a metal layer such as Al on the silicon wafer 50 and patterning the metal layer by a photolithographic process and an etching process.

Figure 6B:
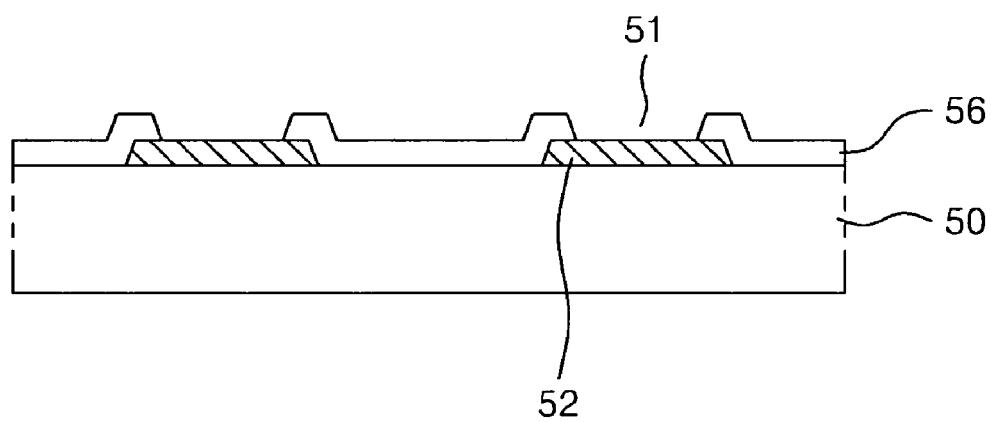

Referring to FIG. 6B, the protective layer 56 is formed on the silicon wafer 50 on which the driving circuit and the chip pad 52 are formed, and a contact hole 51 exposing the chip pad 52 is formed by penetrating the protective layer 56. In exemplary embodiments, the protective layer 56 having the contact hole 51 may be formed by depositing an inorganic insulating material such as SiNx on the silicon wafer on which the driving circuit and the chip pad 52 are formed and patterning the inorganic insulating material by a photolithographic process and an etching process.

Figure 6C:
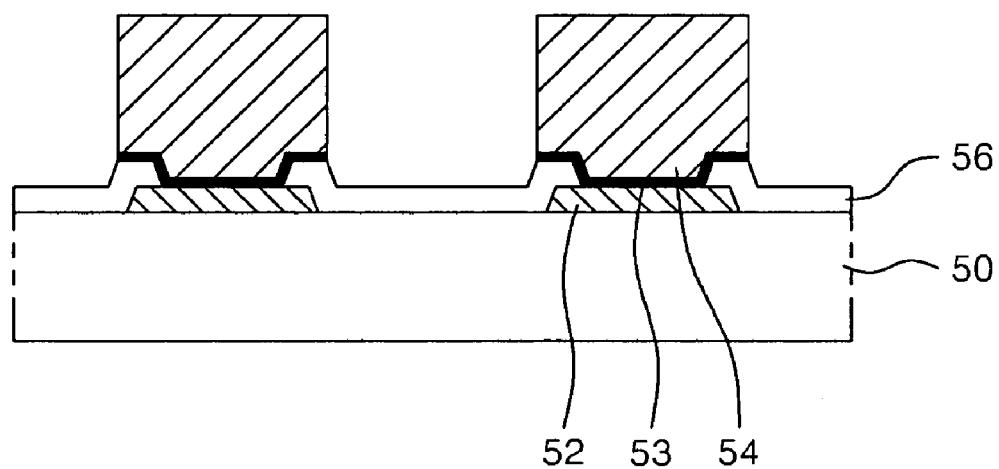

Referring to FIG. 6C, the barrier metal layer 53 and the bump 54 are formed. The bump 54 is connected to the chip pad 52 via a portion of the chip pad 52 exposed through the contact hole 51 of the protective layer 56. In exemplary embodiments, the barrier metal layer 53 and the bump 54 may be formed by depositing a barrier metal layer such as Au/Ni/Ti and a bump metal such as Au on the protective layer 56 and patterning those metal layers by a photolithographic process and an etching process.

Figure 6D:
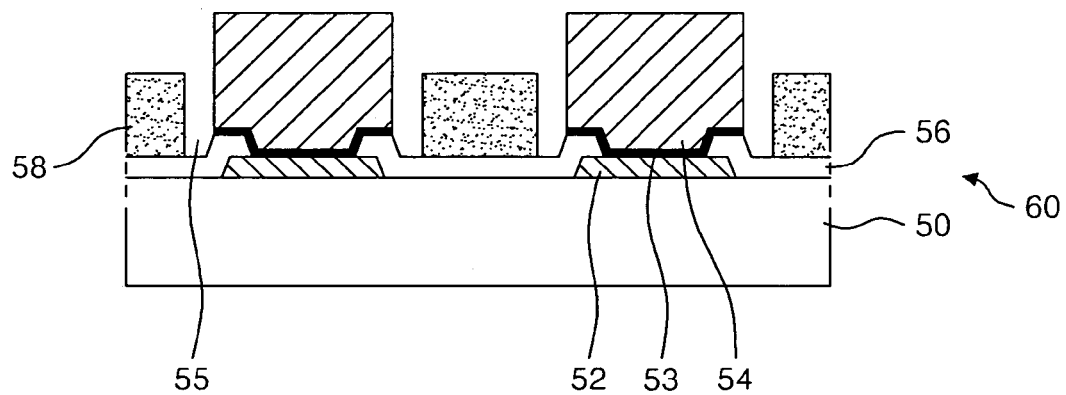

Referring to FIG. 6D, the organic insulating layer 58 for protecting the driving circuit and exposing the bump 54 is formed on the protective layer 56. In exemplary embodiments, the organic insulating layer 58 may be formed by forming a photosensitive organic insulating layer of polyimide series on the protective layer 56 on which the bump 54 is formed and exposing and developing the organic insulating layer by a photolithographic process.

In one exemplary embodiment, the driving chip 60 completed through the processes of FIGS. 6A-6D is packaged by coating the ACF 45 on the substrate 30 on which the electrode pad 36 is formed and aligning, heating and pressing the driving chip 60 on the ACF 45. The ACF 45 may include ACF resin 44 and conductive particles 42. Advantageously, a flow of the ACF resin 44 and the conductive particles 42 decreases in an area of the driving chip 60 by the organic insulating layer 58 existing in the space between the bumps 54 and thus the remaining ratio of the conductive particles 42 under the bump 54 corresponding to an electrode pad is increased and improved. In another exemplary embodiment, the organic insulating layer 58 may preferably include a lower height or thickness than the bump 54.

Figure 7:
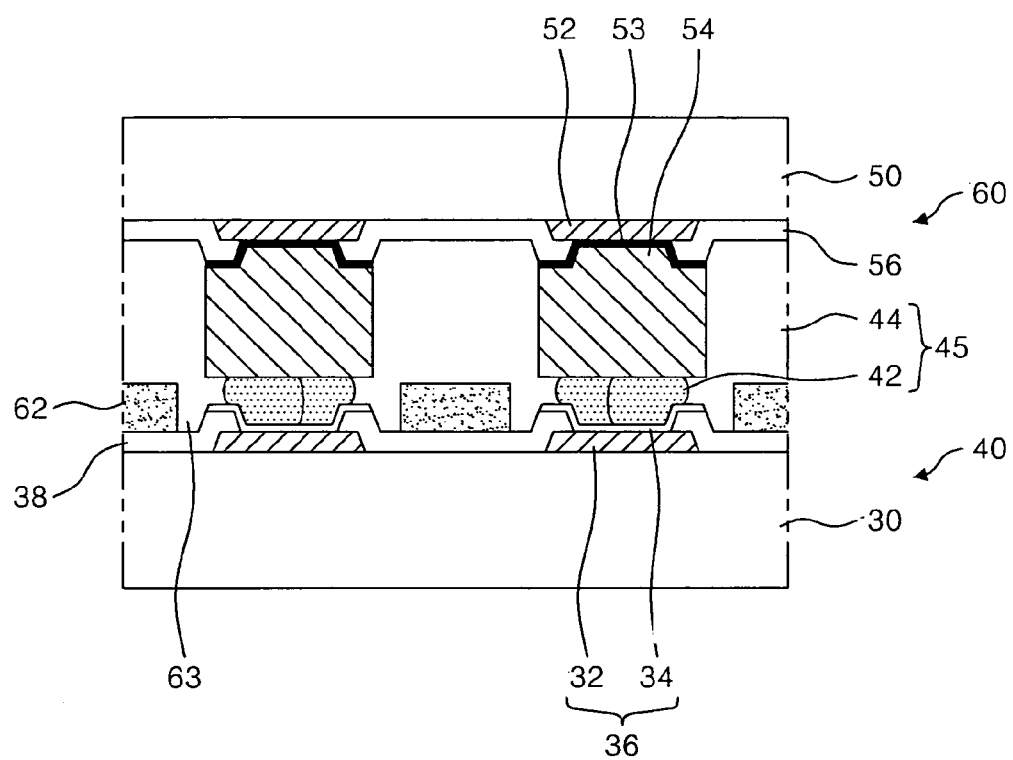
FIG. 7 is a cross-sectional view partially illustrating another exemplary embodiment of a display panel in which a COG type driving chip is packaged according to the present invention.
Figure 8:
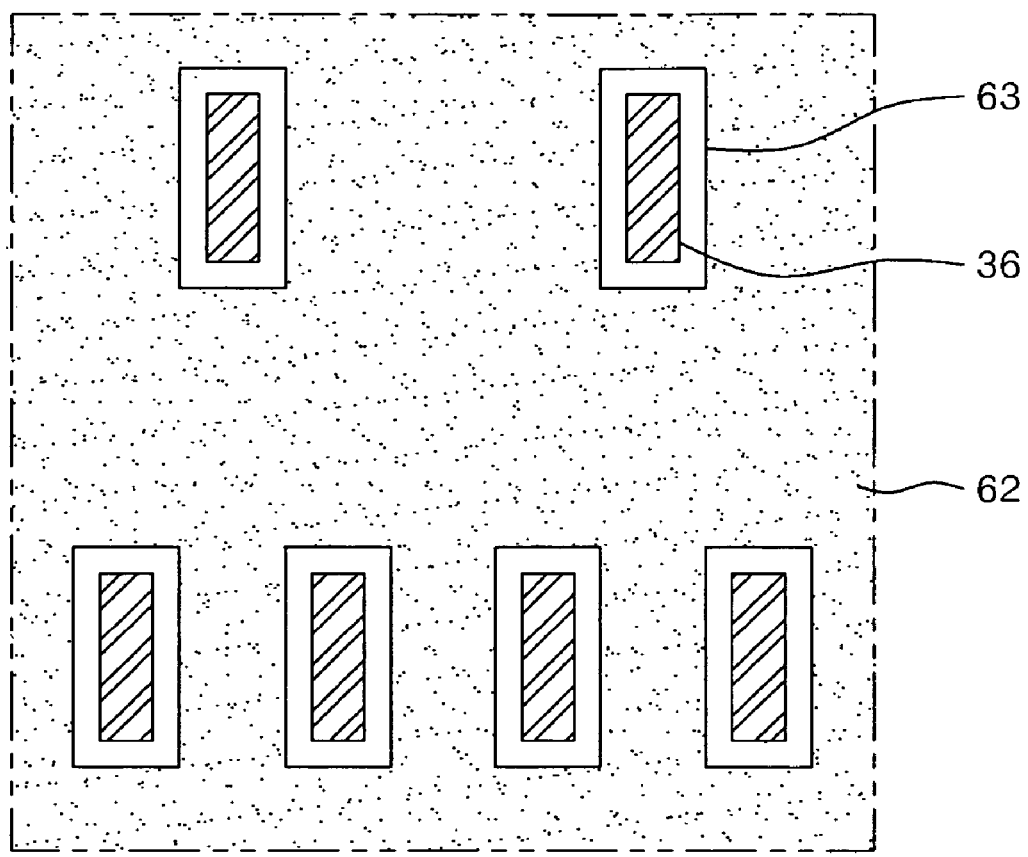
FIG. 8 is a plane view partially illustrating a pad area of the display panel shown in FIG. 7.

FIG. 7 is a cross-sectional view partially illustrating another exemplary embodiment of a display panel 40 in which a driving chip 60 is packaged according to the present invention, and FIG. 8 is a plane view illustrating a pad area of the display panel 40 shown in FIG. 7.

Referring to FIG. 7, the display panel 40 in which the driving chip 60 is packaged has the same construction as that shown in FIG. 3 except that an organic insulating layer 62 is formed in a space between the electrode pads 36, instead of in a space between bumps 54 of the driving chip 60. Therefore, a detailed description of the repetitive elements will be omitted.

The driving chip 60 includes a chip pad 52 connected to a driving circuit (not shown) formed on a silicon wafer 50, a protective layer 56 formed on the silicon wafer 50 and having a contact hole exposing the chip pad 52, and a bump 54 connected to the chip pad 52 through the contact hole of the protective layer 56 and serves as a terminal. In exemplary embodiments, the driving chip 60 may also include an organic insulating layer (not shown) formed on the protective layer 56 of the driving circuit region except at a terminal area where the bump 54 is formed, in order to protect the driving circuit region. A terminal area where the bump 54 is formed may also be considered a "peripheral region" of the driving chip 60. In other exemplary embodiments, the driving chip 60 may also include a barrier metal layer 53 formed between the chip pad 52 and the bump 54.

An electrode pad 36 formed on a lower substrate 30 of the display panel 40. The electrode pad includes a lower electrode pad 32 extended from signal lines (not shown) of an image display part and an upper electrode pad 34 connected to the lower electrode pad 32 through a contact hole penetrating an insulating layer 38. The display panel 40 includes the organic insulating layer 62 formed with a higher height or thickness in a direction substantially perpendicular to the substrate 30 than the electrode pad 36 to isolate the electrode pad 36. The organic insulating layer 62 extends upward from the insulating layer 38, or the substrate 30 and is disposed a distance away from the electrode pad 36 and the bump 54. An upper edge of the organic insulating layer 62 may be disposed at substantially the same level as a bottom edge of the bump 54.

The organic insulating layer 62 is formed on the insulating layer 38 of the lower substrate 30. An open hole 63 separated from the electrode pad 36 is formed on the organic insulating layer 62 to isolate the electrode pad 36 as shown in FIG. 8. This organic insulating layer 62 is formed to have a higher height than the electrode pad 36. In exemplary embodiments, if the driving chip 60 is packaged through the ACF 45, the organic insulating layer 62 may be formed to extend downward from the silicon wafer 50 and have a lower height than the bump 44 of the driving chip 60. Advantageously, when the driving chip 60 is packaged on the substrate 30 including the organic insulating layer 62 extended upward from the substrate 30 to a height greater than the electrode pad 36, a difference in pressure between under the bump 54 of the driving chip 60 and in a space between the bumps 54 is reduced, preventing ACF conductive particles 42 from escaping into the space between the bumps 54 from under the bump 54 of the driving chip 60.

In exemplary embodiments, the open hole 63 surrounding the electrode pad 36 may have a wider cross sectional area than the electrode pad 36 as illustrated in FIG. 8. In other words, an edge of the open hole 63 is separated from that of the electrode pad 36, essentially forming a gap between the electrode pa 36 and the organic insulating layer 62, such that adequately sized cross sectional areas of the electrode pad 36 and the bump 54 which can contact the ACF conductive particles 42 are sufficiently ensured. In alternative embodiments, the open hole 63 may have substantially similar or effectively the same cross sectional area as the electrode pad 36 such that the organic insulating layer 62 may be in contact with aside of the electrode pad 36.

In exemplary embodiments, the driving chip 60 having such a configuration may be packaged on the substrate 30 of the display panel 40 by coating the ACF 45 on a pad area of the substrate 30 and aligning, heating and pressing the driving chip 60. The ACF 45 may include the ACF resin 44 including the conductive particles 42. Since the organic insulating layer 62 is disposed between the bumps 54 and includes a lower height than the bump 54, a difference in pressure decreases between under the bump 54 and in the space between the bumps 54, that is, between under the bump 54 and over the organic insulating layer 62 protruding from the substrate 30. A flow of the conductive particles 42 decreases together with the ACF resin 44 and thus the number of the conductive particles 42 escaping into the space between the bumps 54 from under the bump 54 may be decreased. Advantageously, the remaining ratio of the conductive particles 42 under the bump 54 is improved and the connection resistance between the bump 54 of the driving chip 60 and the electrode pad 36 of the display panel 40 may be reduced.

FIGS. 9A to 9D are cross sectional view illustrating an exemplary embodiment of a manufacturing method of the display panel 40 shown in FIG. 7 according to the present invention.

Figure 9A:
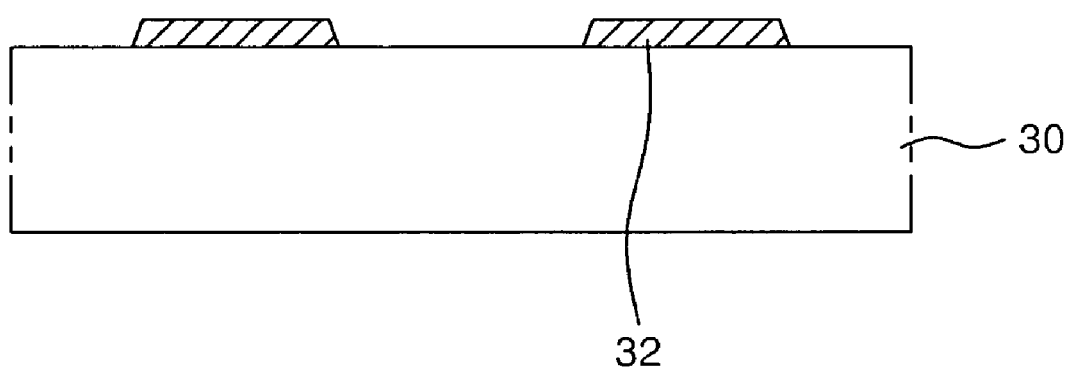
FIGS. 9A to 9D are cross sectional view illustrating an exemplary embodiment of a manufacturing method of the display panel shown in FIG. 7.

Referring to FIG. 9A, the lower electrode pad 32 is formed on the substrate 30 together with signal lines (not shown) of an image display part. In exemplary embodiments, the lower electrode pad 32 may be formed together with the signal lines of the image display part by depositing a metal layer of Al or Mo series on the substrate 30 and patterning the metal layer by a photolithographic process and an etching process.

Figure 9B:
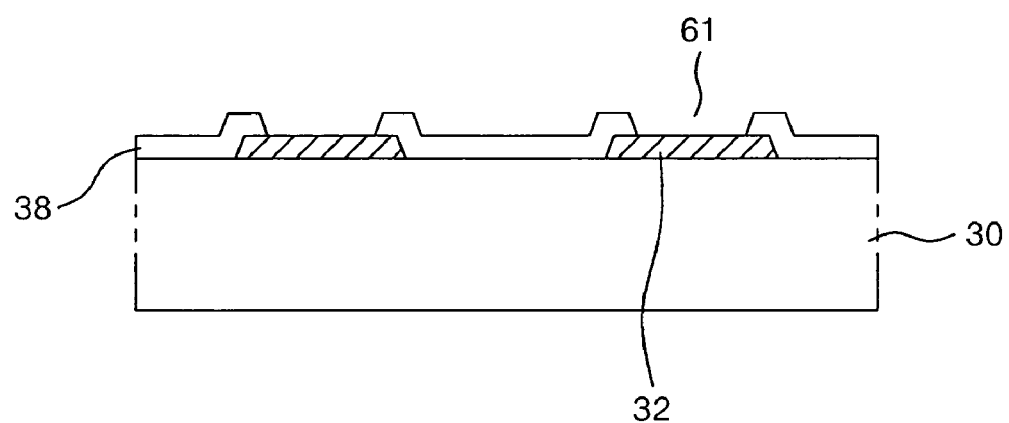

Referring to FIG. 9B, the insulating layer 38 is formed on the substrate 30 on which the lower electrode pad 32 is formed together with the signal lines of the image display part. A contact hole 61 exposing the lower electrode pad 32 is formed in the insulating layer 38. In exemplary embodiments, the insulating layer 38 having the contact hole 61 may be formed by depositing an inorganic insulating material such as SiNx on the substrate 30 on which the signal lines and the lower electrode pad 32 are formed and patterning the inorganic insulating material by a photolithographic process and an etching process.

Figure 9C:
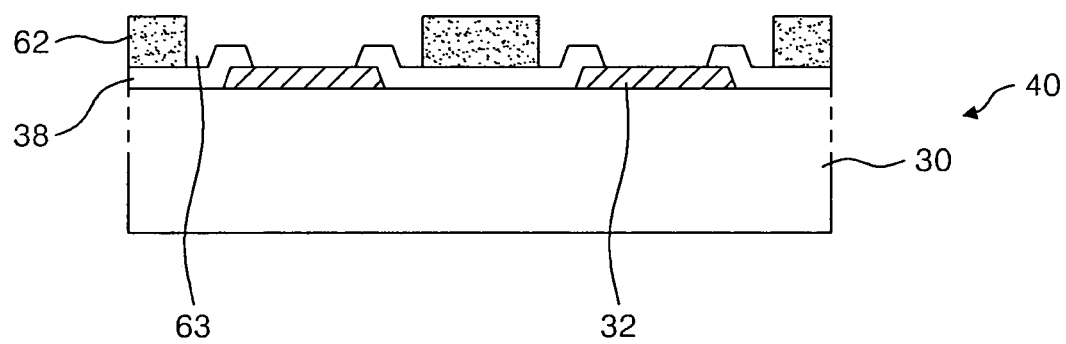

Referring to FIG. 9C, the organic insulating layer 62 having the open hole 63 exposing the lower electrode pad 32 is formed on the insulating layer 38. In exemplary embodiments, the organic insulating layer 62 may be formed by depositing a photosensitive organic insulating material of polyimide series on the insulating layer 38 and exposing and developing the organic insulating material by a photolithographic process.

Figure 9D:
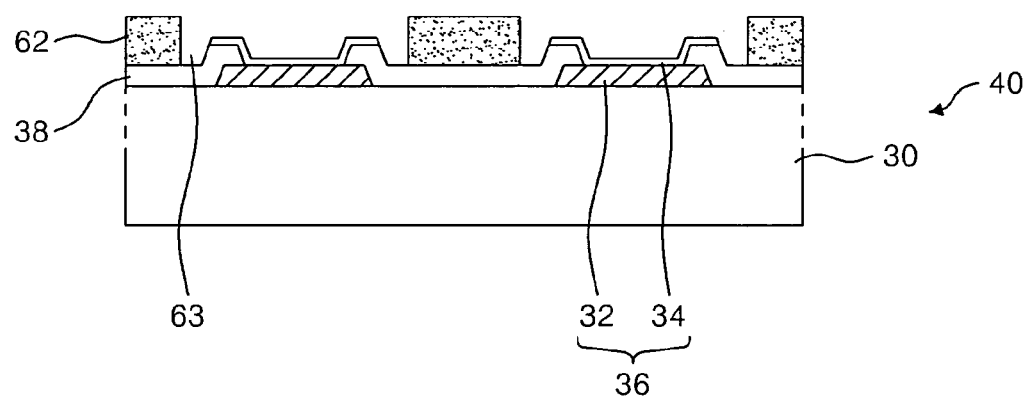

Referring to FIG. 9D, the upper electrode pad 34 connected to the lower electrode pad 32 exposed through the open hole 63 of the organic insulating layer 62 is formed. In exemplary embodiments, the upper electrode pad 34 is formed by depositing a transparent conductive material on the organic insulating layer 62 and patterning the transparent conductive material by a photolithographic process and an etching process. In other exemplary embodiments, the upper electrode pad 34 may be formed together with a pixel electrode (not shown) formed by a sub pixel unit (not shown) in the image display part.

In one exemplary embodiment, the ACF 45 is coated on a pad region of the substrate 30 completed through the processes illustrated in FIGS. 9A-9D and the driving chip 60 is packaged by aligning, heating and pressing the driving chip 60 on the ACF 45. A flow of the ACF resin 44 and the conductive particles 42 decreases in an area where the organic insulating layer 62 exists in the space between the bumps 54, where the organic insulating layer 62 includes a lower height than the bump 54. Advantageously, the remaining ratio of the conductive particles 42 under the bump 54 is improved.

Figure 10:
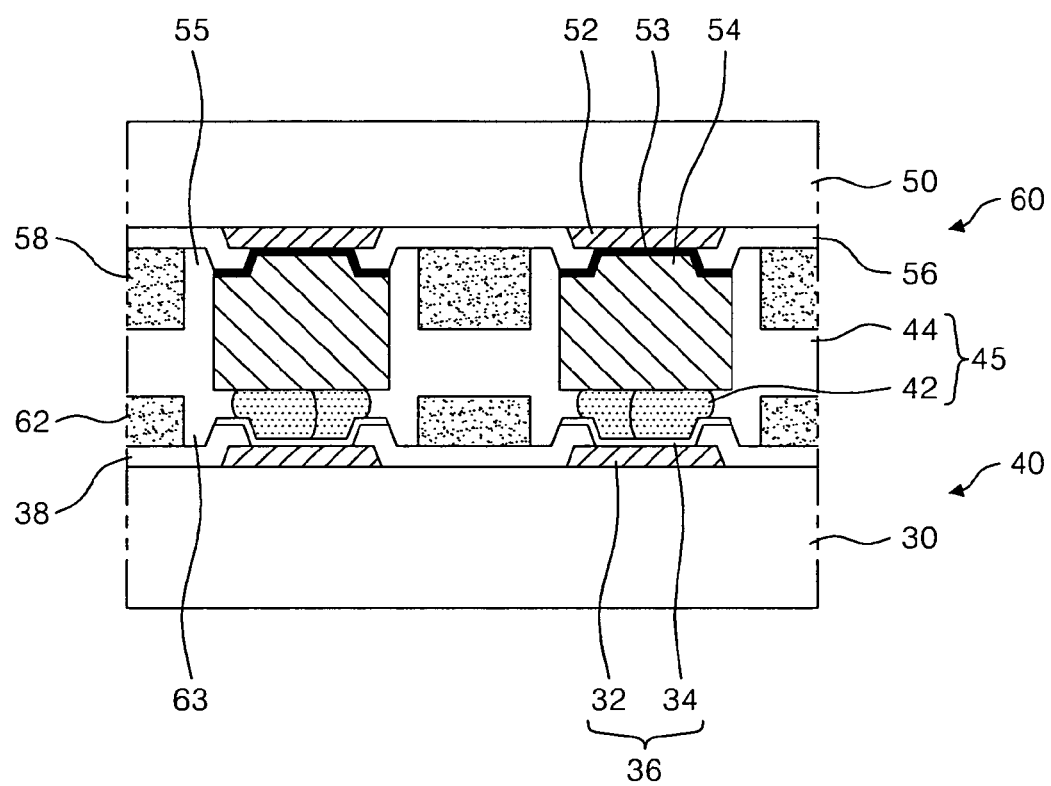
FIG. 10 is a cross-sectional view partially illustrating an exemplary embodiment of a display panel on which a COG type driving chip is packaged according to the present invention.

FIG. 10 is a cross-sectional view partially illustrating another exemplary embodiment of a display panel 40 in which a driving chip 60 is packaged according to the present invention.

The display panel 40 in which the driving chip 60 is packaged has the same elements as those shown in FIG. 3 except a second organic insulating layer 62 is additionally formed in a space between electrode pads 36. Therefore, a detailed description of the repetitive elements will be omitted.

The driving chip 60 includes a chip pad 52 connected to a driving circuit (not shown) formed on a silicon wafer 50, a protective layer 56 formed on the silicon wafer 50 and having a contact hole exposing the chip pad 52, and a bump 54 connected to the chip pad 52 through the contact hole of the protective layer 56 and serving as a terminal. A first organic insulating layer 58 is formed on the protective layer 56 and surrounds the bump 54. The organic insulating layer 58 includes a lower height than the bump 54. The first organic insulating layer 58 is extended to a terminal area where the bump 54 is formed, also known as a peripheral region of the driving chip 60, and includes an open hole 55 exposing the bump 54, as illustrated in FIGS. 4, 5 and 10. The open hole 55 formed in the first organic insulating layer 58 and has a wider cross sectional area than the bump 54 as illustrated in FIGS. 4 and 5 so that the cross sectional area of the bump 54 that may be in contact with ACF conductive particles 42 is sufficiently ensured. In alternative exemplary embodiments, the open hole 55 may have the substantially similar or essentially the same cross sectional area as the bump 54 such that the organic insulating layer 58 contacts sides of the bump 54. In one exemplary embodiment, the driving chip 60 having such a configuration is completed through the manufacturing method described with reference to FIGS. 6A to 6D.

An electrode pad 36 formed on a lower substrate 30 of the display panel 40. The electrode pad 36 includes a lower electrode pad 32 extended from signal lines (not shown) of an image display part and an upper electrode pad 34 connected to the lower electrode pad 32 through a contact hole penetrating the insulating layer 38. The display panel 40 includes a second organic insulating layer 62 formed on the substrate 30 and surrounding the electrode pad 36. The second organic insulating layer 62 extending from the insulating layer 38 includes a higher height than the electrode pad 36.

The second organic insulating layer 62 is formed on an insulating layer 38 of the lower substrate 30. An edge of an open hole 63 is separated from the electrode pad 36 by a gap is formed on the second organic insulating layer 62 and surrounds the electrode pad 36, as shown in FIG. 8. The organic insulating layer 62 extends from the insulating layer 38 and is higher in height than the electrode pad 36. When the driving chip 60 is packaged through an ACF 45, the organic insulating layer 62 extends to a height lower than the bump 54 of the driving chip 60. The second organic insulating layer 62 is separated from the first organic insulating layer 56 at a predetermined distance or interval. The open hole 63 of the second organic insulating layer 62 has a wider cross sectional area than the electrode pad 36 as illustrated in FIG. 8 such that the cross sectional areas of the electrode pad 36 and the bump 54 contacting the ACF conductive particles 42 is sufficiently ensured. In alternative exemplary embodiments, the open hole 63 of the second organic insulating layer 62 may have substantially the same cross sectional area as the electrode pad 36 such that the second organic insulating layer 62 contacts a side of the electrode pad 36. In one exemplary embodiment, the display panel having such a configuration may be completed through the manufacturing method described with reference to FIGS. 9A to 9D.

In exemplary embodiments, the first organic layer 58 and the second organic layer 62 may include substantially same widths as measured in a direction substantially parallel to the silicon wafer 50 and the substrate 30, respectively. The first organic layer 58 and the second organic layer 62 may be substantially centered between pairs of the bump 54 and electrode pad 36, respectively, or may be disposed closer to one of a pair of bump 54 and/or electrode pad 36. The first organic layer 58 and the second organic layer 62 may be positioned corresponding to each other such that their widths substantially coincide or their widths are offset relative to each other.

In one exemplary embodiment, the driving chip 60 is packaged on the substrate 30 of the display panel 40 by coating the ACF 45 on a pad region of the substrate 30 on which the electrode pad 36 is formed and aligning, heating and pressing the driving chip 60. Since the first organic insulating layer 58 having a lower thickness than the bump 54 exists in the space between the bumps 54 and the second organic insulating layer 62 separated from the first organic insulating layer 58 at regular intervals exists in the space between the electrode pads 36, a difference in pressure between under the bump 54 and in the space between the bumps 54 decreases. That is, a difference in pressure between under the bump 54 and in the space between the first and second organic insulating layers 58 and 62 may be decreased. A flow of the conductive particles 42 along with the ACF resin 44 is decreased and the number of the conductive particles 42 moving into the space between the bumps 54 from under the bumps 54 may be reduced. Advantageously, the remaining ratio of the conductive particles 42 under the bump 54 is improved, or increased, and the connection resistance between the bump 54 of the driving chip 60 and the electrode pad 36 of the display panel 40 may be decreased.

In exemplary embodiments, the display panel into which the driving chip according to exemplary embodiments of the present invention is packaged may be applied to flat panel displays such as an LCD and an OLED. An exemplary embodiment of an LCD into which an exemplary embodiment of the present invention is applied will now be described with reference to FIG. 11.

Figure 11:
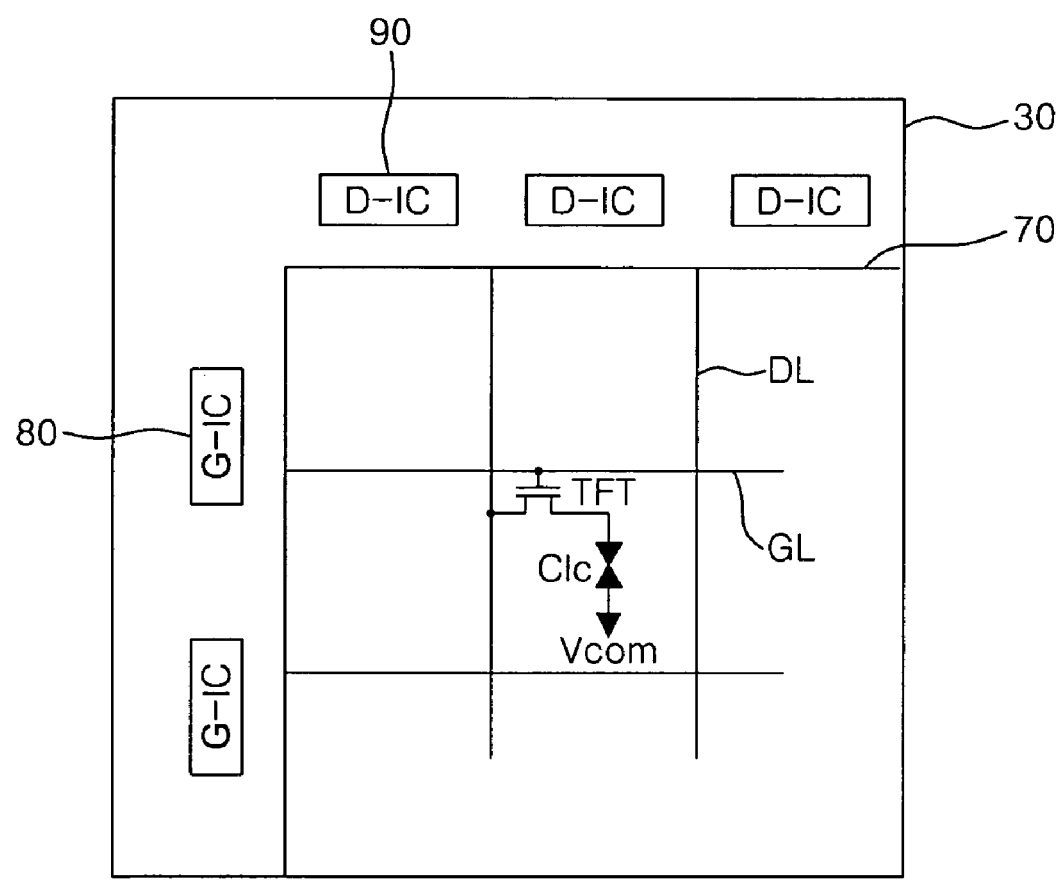
FIG. 11 schematically illustrates an LCD panel using a display panel in which an exemplary embodiment of a COG type driving chip according to the present invention is packaged.

FIG. 11 schematically illustrates an LCD panel using a display panel in which an exemplary embodiment of a driving chip according to the present invention is packaged.

The LCD panel illustrated in FIG. 11 includes a lower substrate 30 and an upper substrate 70 with a liquid crystal disposed therebetween. The upper substrate 70 causes a peripheral region of the lower substrate 30 to be exposed. The peripheral region may also be considered as a circuit region of the lower substrate 30 on which gate driving chips 80 and data driving chips 90 are formed.

A display region of the lower substrate 30 includes a gate line GL and a data line DL which cross each other in directions transverse to each other forming a substantial matrixshaped arrangement, a thin film transistor TFT connected at an intersection of the gate line GL and data line DL, and a pixel electrode of a sub pixel unit connected to the thin film transistor TFT. The pixel electrode may be overlapped with a common electrode formed in the upper substrate 70 with a liquid crystal interposed therebetween and forms a liquid crystal cell. The liquid crystal cell may also be known as a liquid crystal capacitor Clc. The thin film transistor TFT supplies the pixel electrode with a data signal from the data line DL in response to a gate signal from the gate line GL. The liquid crystal having dielectric anisotropy is driven depending on a difference between the data signal supplied to the pixel electrode and a common voltage Vcom supplied to the common electrode and the transmittance of light is controlled.

In exemplary embodiments, the gate driving chip 80 for driving the gate line GL and the data driving chip 90 for driving the data line DL may be packaged on the peripheral region of the lower substrate 30 by the COG method described above with respect to exemplary embodiments of the present invention.

In other exemplary embodiments, the gate driving chip 80 is packaged on the lower substrate 30 through an ACF and connected to a gate pad extended from the gate line GL. The data driving chip 90 is packaged on the lower substrate 30 through the ACF and connected to a data pad extended from the data line DL. A first organic insulating layer may be formed in a space between bumps of the gate and data driving chips 80 and 90. A second organic insulating layer may be formed in a space between the gate pads of the lower substrate 30 and a space between data pads of the lower substrate 30. In alternative exemplary embodiments, the first organic insulating layer is formed in a space between bumps of the gate and data driving chips 80 and 90, and a second organic insulating layer is formed in a space between the gate pads of the lower substrate 30 and a space between the data pads of the lower substrate 30. A flow of conductive particles decreases together with an ACF resin when the gate and data driving chips 80 and 90 are packaged on the lower substrate 30. The number of the conductive particles 42 escaping to the space between the bumps 54 from under the bump 54 may be reduced. Advantageously, the remaining ratio of the conductive particles 42 under the bump 54 is improved and the connection resistance between the bump 54 of the driving chip 60 and the electrode pad 36 of the display panel 40 may be reduced.

In an exemplary embodiment of a semiconductor chip and manufacturing method thereof according to the present invention, a flow of an ACF may be decreased when the semiconductor chip is packaged in a display panel by providing an organic insulating layer in a space between bumps to improve the remaining ratio of conductive particles existing between a bump and a pad.

In an exemplary embodiment of a display panel and manufacturing method thereof according to the present invention, a flow of an ACF may be decreased when the semiconductor chip is packaged in a display panel by providing an organic insulating layer in a space between pads thereby improving the remaining ratio of conductive particles existing between a bump and a pad.

Another exemplary embodiment of the display panel in which the semiconductor chip is package and manufacturing thereof according to the present invention includes a first organic insulating layer in a space between bumps of a driving chip and a second organic insulating layer in a space between pads of the display panel. Advantageously, when the semiconductor chip is packaged in the display panel including this configuration, a flow of the ACF is reduced and the remaining ratio of the conductive particles existing between the bump and pad may be improved.

In another exemplary embodiment of he display panel in which the semiconductor chip is packaged and manufacturing method thereof according to the present invention, the reliability of connection between the semiconductor chip and the display panel may be ensured by improving the remaining ratio of the ACF conductive particles. Advantageously, the prices of ACF raw materials may be lowered by reducing the amount of the conductive particles contained in the ACF.

In another exemplary embodiment of the display panel in which the semiconductor chip is packaged and manufacturing method thereof according to the present invention, the area and pitch of the bump suitable for high resolution may be reduced by improving the remaining ratio of the. ACF conductive particles and also reduce the cost.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A display panel comprising:
   a substrate;
   an electrode pad disposed on the substrate;
   a first insulating layer disposed on the substrate, between the electrode pad and an adjacent electrode pad, and including an open hole isolating the electrode pad;
   a protective layer disposed between the substrate and the first insulating layer, and
   a semiconductor chip including a bump electrically connected to the electrode pad through a conductive particle which is interposed between the bump and the electrode pad,
   wherein the first insulating layer reduces a space between the bump and an adjacent bump such that the first insulating layer prevents the conductive particle connected to the bump from moving to the space between the adjacent bumps.

2. The display panel according to claim 1, wherein the first insulating layer is an organic insulating layer.

3. The display panel according to claim 1, wherein the electrode pad comprises:
   a lower electrode pad connected to a signal line formed on the substrate; and
   an upper electrode pad connected to the lower electrode pad through a contact hole of a second insulating layer formed on the lower electrode pad.

4. The display panel according to claim 1, wherein a cross sectional area of the open hole is larger than that of the electrode pad.

5. The display panel according to claim 1, wherein the first insulating layer is extended from the substrate further than the electrode pad.

6. The display panel according to claim 5, wherein the first insulating layer extends to a height lower than a bump.

7. A display panel including:
   a semiconductor chip comprising:
      a plurality of bumps connected to a driving circuit integrated on a first substrate;
      a first insulating layer disposed on the driving circuit and between adjacent bumps; and
      a protective layer disposed between the first substrate and the first insulating layer, wherein the first insulating layer is extended from the first substrate less than the plurality of bumps;
a second substrate;
an electrode pad formed on the second substrate and connected to a signal line formed on the second substrate;
an anisotropic conductive film attaching the semiconductor chip to the second substrate and including a conductive particle connecting a bump of the semiconductor chip to the electrode pad, and
a second insulating layer disposed on the second substrate, between the electrode pad and an adjacent electrode pad, and including an open hole isolating the electrode pad;
wherein the first insulating layer and the second insulating layer reduce a space between the adjacent bumps such that the first insulating layer and the second insulating layer prevent the conductive particle connected to the bump of the semiconductor chip from moving to the space between the adjacent bumps.

8. The display panel according to claim 7, wherein the first insulating layer and the second insulating layer are organic insulating layers.

9. The display panel according to claim 7, wherein the electrode pad comprises:
a lower electrode pad connected to the signal line formed on the second substrate; and
an upper electrode pad connected to the lower electrode pad through a contact hole of a third insulating layer formed on the lower electrode pad.

10. The display panel according to claim 7, wherein a cross sectional area of the open hole formed on the second insulating layer is larger than a cross sectional area of the electrode pad.

11. The display panel according to claim 7, wherein the second insulating layer extends further from the second substrate than the electrode pad.

12. The display panel according to claim 7, wherein the first and second insulating layers are separated from each at predetermined intervals from each other when the semiconductor chip is packaged on the second substrate.

13. A display panel comprising:
a semiconductor chip comprising:
a plurality of bumps connected to a driving circuit integrated on a first substrate;
a first insulating layer being formed with a smaller thickness than the plurality of bumps, the first insulating layer being formed between pairs of bumps; and
a protective layer disposed between the first substrate and the first insulating layer;
a second substrate;
an electrode pad formed on the second substrate and connected to a signal line formed on the second substrate;
an anisotropic conductive film attaching the semiconductor chip to the second substrate and including a conductive particle connecting a bump of the semiconductor chip to the electrode pad, and
a second insulating layer disposed on the second substrate, between the electrode pad and an adjacent electrode pad, and including an open hole isolating the electrode pad
wherein the first insulating layer and the second insulating layer reduce a space between adjacent bumps such that the first insulating layer and the second insulating layer prevent the conductive particle connected to the bumps from moving to the space to between adjacent bumps.

* * * * *